US011107758B2

(12) United States Patent
Chiu et al.

(10) Patent No.: US 11,107,758 B2
(45) Date of Patent: Aug. 31, 2021

(54) FAN-OUT PACKAGE STRUCTURE AND METHOD

(71) Applicant: Taiwan Semiconductor Manufacturing Company, Ltd., Hsinchu (TW)

(72) Inventors: Tzu-Wei Chiu, Hsinchu (TW); Sao-Ling Chiu, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 16/656,019

(22) Filed: Oct. 17, 2019

(65) Prior Publication Data

US 2020/0051900 A1 Feb. 13, 2020

Related U.S. Application Data

(60) Continuation of application No. 16/224,233, filed on Dec. 18, 2018, now Pat. No. 10,510,648, which is a
(Continued)

(51) Int. Cl.
*H01L 23/48* (2006.01)
*H01L 23/52* (2006.01)
(Continued)

(52) U.S. Cl.
CPC ...... *H01L 23/49822* (2013.01); *H01L 21/486* (2013.01); *H01L 21/4846* (2013.01);
(Continued)

(58) Field of Classification Search
CPC ........... H01L 23/49822; H01L 21/4846; H01L 21/4853; H01L 21/4857; H01L 21/486; H01L 21/568; H01L 21/6835; H01L 23/49805; H01L 23/49811; H01L 23/49827; H01L 24/19; H01L 23/49816; H01L 23/53228; H01L 23/53233; H01L 2021/6006; H01L 2221/68372; H01L 2221/68381; H01L 2224/04105; H01L 2924/18162; H01L 2224/73265;
(Continued)

(56) References Cited

U.S. PATENT DOCUMENTS 5,841,193 A * 11/1998 Eichelberger ....... H01L 25/0655
257/723
8,884,433 B2 11/2014 Lin et al.
(Continued)

FOREIGN PATENT DOCUMENTS

KR 20150082087 A 7/2015

*Primary Examiner* — Niki H Nguyen
(74) *Attorney, Agent, or Firm* — Slater Matsil, LLP

(57) ABSTRACT

A method comprises embedding a semiconductor structure in a molding compound layer, depositing a plurality of photo-sensitive material layers over the molding compound layer, developing the plurality of photo-sensitive material layers to form a plurality of openings, wherein a first portion and a second portion of an opening of the plurality of openings are formed in different photo-sensitive material layers and filling the first portion and the second portion of the opening with a conductive material to form a first via in the first portion and a first redistribution layer in the second portion.

20 Claims, 16 Drawing Sheets

Related U.S. Application Data continuation of application No. 15/907,612, filed on Feb. 28, 2018, now Pat. No. 10,163,770, which is a division of application No. 15/200,505, filed on Jul. 1, 2016, now Pat. No. 9,953,911.

(51) Int. Cl.

| | | |
|---|---|---|
| *H01L 29/40* | (2006.01) | |
| *H01L 23/498* | (2006.01) | |
| *H01L 23/00* | (2006.01) | |
| *H01L 21/48* | (2006.01) | |
| *H01L 21/56* | (2006.01) | |
| *H01L 21/683* | (2006.01) | |
| *H01L 23/532* | (2006.01) | |
| *H01L 21/60* | (2006.01) | |

(52) U.S. Cl.
CPC ...... *H01L 21/4853* (2013.01); *H01L 21/4857* (2013.01); *H01L 21/568* (2013.01); *H01L 21/6835* (2013.01); *H01L 23/49805* (2013.01); *H01L 23/49811* (2013.01); *H01L 23/49827* (2013.01); *H01L 24/19* (2013.01); *H01L 23/49816* (2013.01); *H01L 23/53228* (2013.01); *H01L 23/53233* (2013.01); *H01L 2021/6006* (2013.01); *H01L 2221/68372* (2013.01); *H01L 2221/68381* (2013.01); *H01L 2224/04105* (2013.01); *H01L 2224/12105* (2013.01); *H01L 2224/18* (2013.01); *H01L 2924/18162* (2013.01)

(58) Field of Classification Search
CPC ..... H01L 2924/181; H01L 2224/48227; H01L 2924/15311; H01L 2224/48247; H01L 2224/32245; H01L 2224/19; H01L 2224/0239; H01L 2224/32145; H01L 2224/81; H01L 2224/73204; H01L 2924/014; H01L 2224/12105; H01L 2224/83; H01L 24/97; H01L 2224/92247; H01L 2224/0401; H01L 23/5389; H01L 2224/81815; H01L 21/3128; H01L 24/13; H01L 24/20; H01L 2225/1058; H01L 24/05; H01L 2224/05571; H01L 24/16; H01L 2224/04042; H01L 2224/16227; H01L 23/3114; H01L 25/0657; H01L 23/49838; H01L 24/94; H01L 21/56; H01L 2224/05008; H01L 2224/13
USPC ........................................................ 257/738
See application file for complete search history.

(56) References Cited

U.S. PATENT DOCUMENTS

| | | | |
|---|---|---|---|
| 9,087,832 B2* | 7/2015 | Huang | H01L 23/49822 |
| 9,275,967 B2 | 3/2016 | Liang et al. | |
| 9,385,106 B1 | 7/2016 | Chaware et al. | |
| 2004/0004284 A1 | 1/2004 | Lee et al. | |
| 2006/0187381 A1 | 8/2006 | Yokozawa | |
| 2007/0141757 A1* | 6/2007 | Nomura | H05K 3/4007 |
| | | | 438/125 |
| 2009/0166841 A1* | 7/2009 | Hsu | H01L 24/19 |
| | | | 257/690 |
| 2009/0321916 A1 | 12/2009 | Wang et al. | |
| 2011/0162874 A1 | 7/2011 | Nguyen et al. | |
| 2011/0169133 A1* | 7/2011 | Arai | H01L 28/40 |
| | | | 257/532 |
| 2013/0026639 A1 | 1/2013 | Arnold et al. | |
| 2014/0203429 A1 | 7/2014 | Yu et al. | |
| 2015/0108634 A1* | 4/2015 | Liu | H01L 24/10 |
| | | | 257/737 |
| 2017/0141040 A1* | 5/2017 | Yu | H01L 24/19 |

* cited by examiner

FAN-OUT PACKAGE STRUCTURE AND METHOD

CROSS-REFERENCE TO RELATED APPLICATIONS

This application is a continuation of U.S. application Ser. No. 16/224,233, filed on Dec. 18, 2018, entitled "Fan-Out Package Structure and Method", which is a continuation of U.S. application Ser. No. 15/907,612, filed on Feb. 28, 2018, entitled "Fan-Out Package Structure and Method", now U.S. Pat. No. 10,163,770, which is a divisional of U.S. application Ser. No. 15/200,505, filed on Jul. 1, 2016, entitled "Fan-Out Package Structure and Method", now U.S. Pat. No. 9,953,911, each application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for miniaturization, higher speed and greater bandwidth, as well as lower power consumption and latency has grown recently, there has grown a need for smaller and more creative packaging techniques of semiconductor dies.

As semiconductor technologies further advance, semiconductor devices with a fan-out package have emerged as an effective alternative to further improve the performance of semiconductor devices. In a semiconductor device having a fan-out package, a molding compound layer may be formed around a semiconductor die to provide additional surface area to support the fan-out interconnect structures. For example, a plurality of redistribution layers may be formed over the top surface of the molding compound layer. Furthermore, the redistribution layers are electrically connected to active circuits of the semiconductor die. External input/output pads such as solder balls on under-bump metallization structures may then be formed to electrically connect to the semiconductor die through the redistribution layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
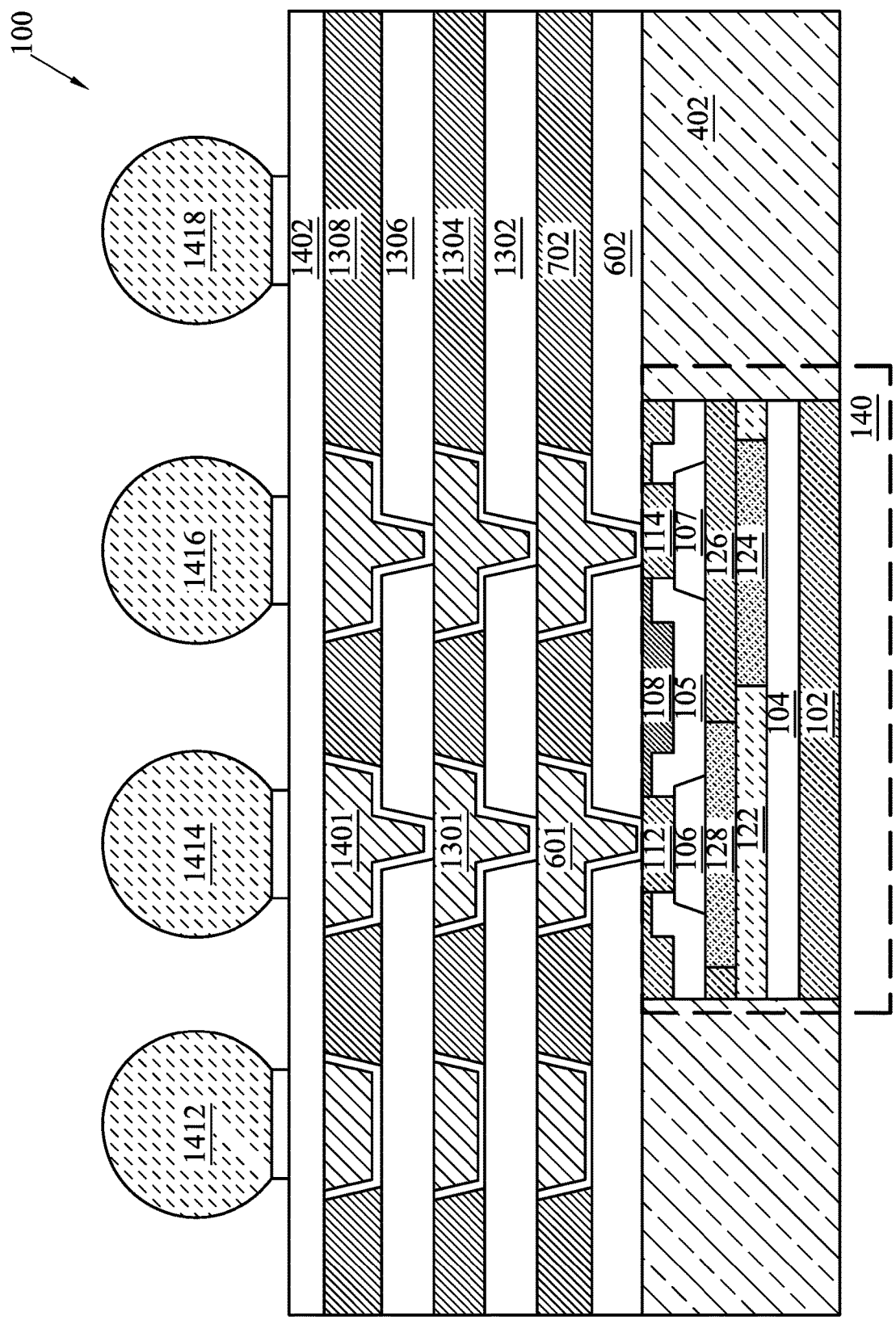
FIG. 1 illustrates a cross sectional view of a semiconductor device having a fan-out package in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, a fabrication process of forming a semiconductor device having a fan-out package. The embodiments of the disclosure may also be applied, however, to a variety of semiconductor structures. Hereinafter, various embodiments will be explained in detail with reference to the accompanying drawings.

FIG. 1 illustrates a cross sectional view of a semiconductor device having a fan-out package in accordance with various embodiments of the present disclosure. The semiconductor device 100 includes a semiconductor chip 140 embedded in a molding compound layer 402 and a plurality of interconnect structures formed over the molding compound layer 402.

As shown in FIG. 1, the semiconductor chip 140 comprises a substrate 102. The substrate 102 may be formed of silicon, silicon germanium, silicon carbide or the like. Alternatively, the substrate 102 may be a silicon-on-insulator (SOI) substrate. The SOI substrate may comprise a layer of a semiconductor material (e.g., silicon, germanium and the like) formed over an insulator layer (e.g., buried oxide and the like), which is formed in a silicon substrate. In addition, other substrates that may be used include multi-layered substrates, gradient substrates, hybrid orientation substrates and the like.

The substrate 102 may further comprise a variety of electrical circuits (not shown). The electrical circuits formed on the substrate 102 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An interlayer dielectric layer 104 is formed on top of the substrate 102. The interlayer dielectric layer 104 may be formed, for example, of a low-K dielectric material, such as silicon oxide. The interlayer dielectric layer 104 may be formed by any suitable method known in the art, such as spinning, chemical vapor deposition (CVD) and plasma enhanced chemical vapor deposition (PECVD). It should also be noted that one skilled in the art will recognize that the interlayer dielectric layer 104 may further comprise a plurality of dielectric layers.

A bottom metallization layer 122 and a top metallization layer 126 are formed over the interlayer dielectric layer 104. As shown in FIG. 1, the bottom metallization layer 122 comprises a first metal line 124. Likewise, the top metallization layer 126 comprises a second metal line 128. Metal lines 124 and 128 are formed of metal materials such as copper or copper alloys and the like. The metallization layers 122 and 126 may be formed through any suitable techniques (e.g., deposition, damascene and the like). Generally, the one or more inter-metal dielectric layers and the associated metallization layers are used to interconnect the electrical circuits in the substrate 102 to each other to form functional circuitry and to further provide an external electrical connection.

It should be noted while FIG. 1 shows the bottom metallization layer 122 and the top metallization layer 126, one skilled in the art will recognize that one or more inter-metal dielectric layers (not shown) and the associated metallization layers (not shown) are formed between the bottom metallization layer 122 and the top metallization layer 126. In particular, the layers between the bottom metallization layer 122 and the top metallization layer 126 may be formed by alternating layers of dielectric (e.g., extremely low-k dielectric material) and conductive materials (e.g., copper).

A passivation layer 105 is formed on top of the top metallization layer 126. In accordance with an embodiment, the passivation layer 105 is formed of non-organic materials such as un-doped silicate glass, silicon nitride, silicon oxide and the like. Alternatively, the passivation layer 105 may be formed of low-k dielectric such as carbon doped oxide and the like. In addition, extremely low-k (ELK) dielectrics such as porous carbon doped silicon dioxide can be employed to form the passivation layer 105.

The passivation layer 105 may be formed through any suitable techniques such as CVD. As shown in FIG. 1, there may be two openings formed in the passivation layer 105. The openings are used to accommodate the top metal pads 106 and 107.

As shown in FIG. 1, the top metal pads 106 and 107 are embedded in the passivation layer 105. In particular, the top metal pads 106 and 107 provide conductive channels between the metal line 128 and a post passivation interconnect structure of the semiconductor chip 140. The top metal pads 106 and 107 may be made of metallic materials such as copper, copper alloys, aluminum, silver, gold and any combinations thereof, and/or multi-layers thereof. The top metal pads 106 and 107 may be formed by suitable techniques such as CVD. Alternatively, the top metal pads 106 and 107 may be formed by sputtering, electroplating and the like.

A dielectric layer 108 is formed on top of the passivation layer 105. In some embodiments, the dielectric layer 108 is a polymer layer. Throughout the description, the dielectric layer 108 may be alternatively referred to as the polymer layer 108.

The polymer layer 108 is made of polymer materials such as epoxy, polyimide and the like. Alternatively, the polymer layer 108 may be formed of suitable polymer dielectric materials such as polybenzoxazole (PBO). The polymer layer 108 may be made by any suitable method known in the art such as spin coating.

A first connector 112 and a second connector 114 are formed in the polymer layer 108. As shown in FIG. 1, the lower portions of the first connector 112 and the second connector 114 are surrounded by the passivation layer 105. The upper portions of the first connector 112 and the second connector 114 are surrounded by the polymer layer 108. The first connector 112 and the second connector 114 may be made of suitable conductive materials such as copper, copper alloys, any combinations thereof, and/or multi-layers thereof. In some embodiments, the first connector 112 and the second connector 114 have a pillar structure.

A plurality of photo-sensitive material layers 602, 702, 1302, 1304, 1306 and 1308 are formed over the molding compound layer 402. A plurality of interconnect structures are formed in the photo-sensitive material layers as shown in FIG. 1. It should be noted that during the process of fabricating the semiconductor device 100, curing processes may be applied to the photo-sensitive material layers 602, 702, 1302, 1304, 1306 and 1308. The photo-sensitive materials may be cross-linked and become polymer materials after the curing processes have been applied to the photo-sensitive material layers 602, 702, 1302, 1304, 1306 and 1308. As a result, the photo-sensitive material layers 602, 702, 1302, 1304, 1306 and 1308 may be alternatively referred to as the polymer layers 602, 702, 1302, 1304, 1306 and 1308.

As shown in FIG. 1, an interconnect structure 601 are formed in the photo-sensitive material layers 602 and 702. The interconnect structure 601 may comprise a via portion formed in the photo-sensitive material layer 602 and a metal line portion formed in the photo-sensitive material layer 702. Both the via portion and the metal line portion of the interconnect structure 601 are surrounded by a seed layer. The via portion of the interconnect structure 601 is electrically connected with the first connector 112 through the seed layer.

The interconnect structures shown in FIG. 1 may form a plurality of stacked via structures. For example, the interconnect structures 601, 1301 and 1401 are vertically aligned to each other. More particularly, the via portion of the interconnect structure 1301 is on top of the metal line portion of the interconnect structure 601. Likewise, the via portion of the interconnect structure 1401 is on top of the metal line portion of the interconnect structure 1301. The stacked via structure formed by the interconnect structures 601, 1301 and 1401 provides a conductive path between the semiconductor chip 140 and the input/output bumps (e.g., bump 1414) of the semiconductor device 100.

In some embodiments, the sidewall of the metal line portion of the interconnect structure 1301 is vertically aligned with the sidewall of the metal line portion of the interconnect structure 601. Likewise, the sidewall of the via portion of the interconnect structure 1301 is vertically aligned with the sidewall of the via portion of the interconnect structure 601. Such a vertical alignment helps to reduce the conduction losses so as to improve the performance of the semiconductor device 100.

It should further be noted that the number of the photo-sensitive material layers (e.g., photo-sensitive material layer 602) and the number of the interconnect structures (e.g., interconnect structure 601) shown in FIG. 1 are merely examples. A person skilled in the art would recognize many variations, alternatives, and modifications. For example, the interconnect structure 601 could comprise more than one interconnect layer and each interconnect layer may accommodate any number of metal lines.

A plurality of bumps 1412, 1414, 1416 and 1418 are formed over a dielectric layer 1402. In some embodiments, the bumps 1412, 1414, 1416 and 1418 are solder balls. There may be a plurality of under bump metallization (UBM) structures formed underneath their respective bumps. The detailed formation processes of the bumps 1412, 1414, 1416 and 1418 and their respective UBM structures will be described below with respect to FIG. 14.

It should be noted that the number of the bumps (e.g., bumps 1412-1418) shown in FIG. 1 is merely an example. A person skilled in the art would recognize many variations, alternatives, and modifications. For example, the semiconductor device 100 could accommodate any number of bumps.

One advantageous feature of the semiconductor device 100 shown in FIG. 1 is that the stacked via structure provides a customer friendly product design solution for achieving better electrical performance.

FIGS. 2-15 illustrate intermediate steps of fabricating the semiconductor device shown in FIG. 1 in accordance with various embodiments of the present disclosure. It should be noted that the fabrication steps as well as the semiconductor structure shown in FIGS. 2-15 are merely an example. A person skilled in the art will recognize there may be many alternatives, variations and modifications.

Figure 2:
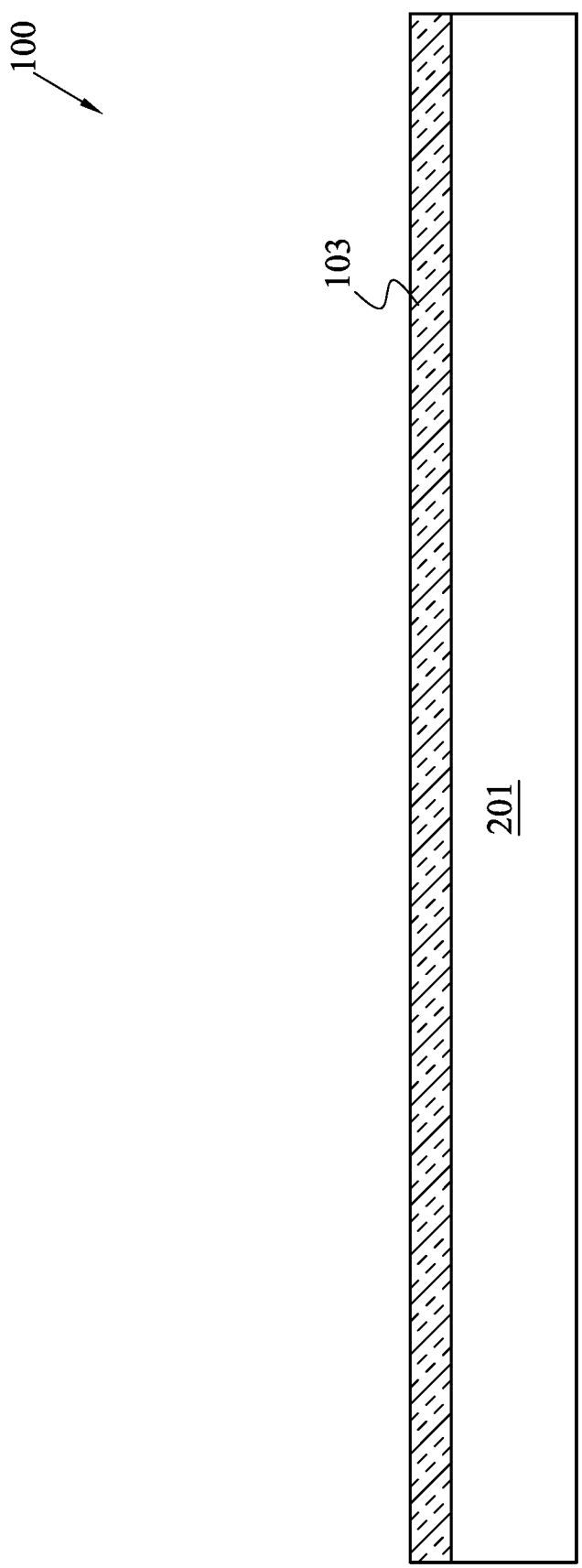
FIGS. 2-15 illustrate intermediate steps of fabricating the semiconductor device shown in FIG. 1 in accordance with various embodiments of the present disclosure.

FIG. 2 illustrates a cross sectional view of a semiconductor device in accordance with various embodiments of the present disclosure. As shown in FIG. 2, a release layer 103 is formed on a carrier 201. The carrier 201 may be formed of silicon, glass, ceramic aluminum oxide, silicon oxide, a combination thereof, and/or the like. In some embodiments, the release layer 103 is formed of an epoxy-based thermal-release material. In alternative embodiments, the release layer 103 may be formed of an ultra-violet (UV) glue, which loses its adhesive property when exposed to UV lights.

The release layer 103 may be formed over the carrier 201 by any suitable semiconductor fabrication techniques. In some embodiments, the release layer 103 may be dispensed as a liquid and cured subsequently. In alternative embodiments, release layer 103 may be laminated onto carrier 201.

Figure 3:
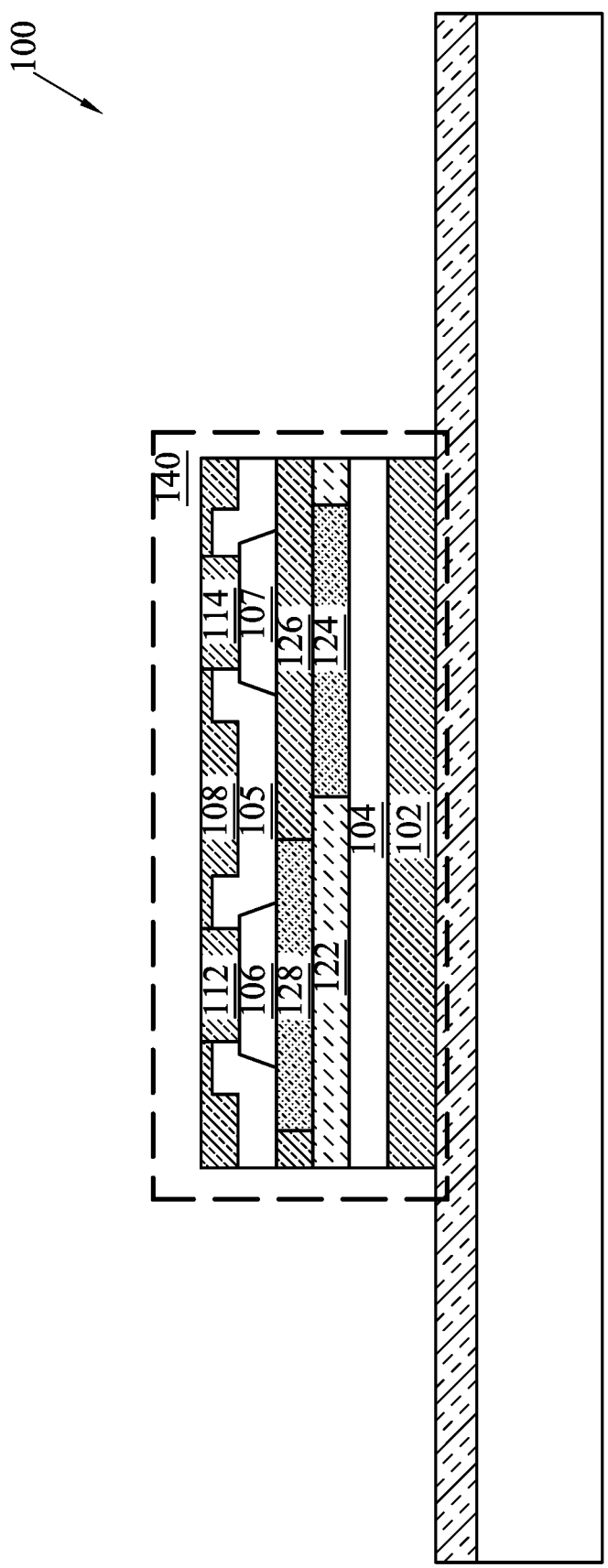

FIG. 3 illustrates a cross sectional view of the semiconductor device shown in FIG. 2 after a semiconductor chip is mounted on the carrier in accordance with various embodiments of the present disclosure. The semiconductor chip 140 is picked and placed on the carrier 201 as shown in FIG. 3. The substrate 102 of the semiconductor chip 140 is in direct contact with the release layer 103. The semiconductor chip 140 comprises a plurality of contact pads. As shown in FIG. 3, the connectors 112 and 114 formed on a top side of the semiconductor chip 140. As shown in FIG. 3, the top surfaces of the connectors 112 and 114 are exposed outside the semiconductor chip 140. Throughout the description, the semiconductor chip 140 may be alternatively referred to as the semiconductor structure 140.

Figure 4:
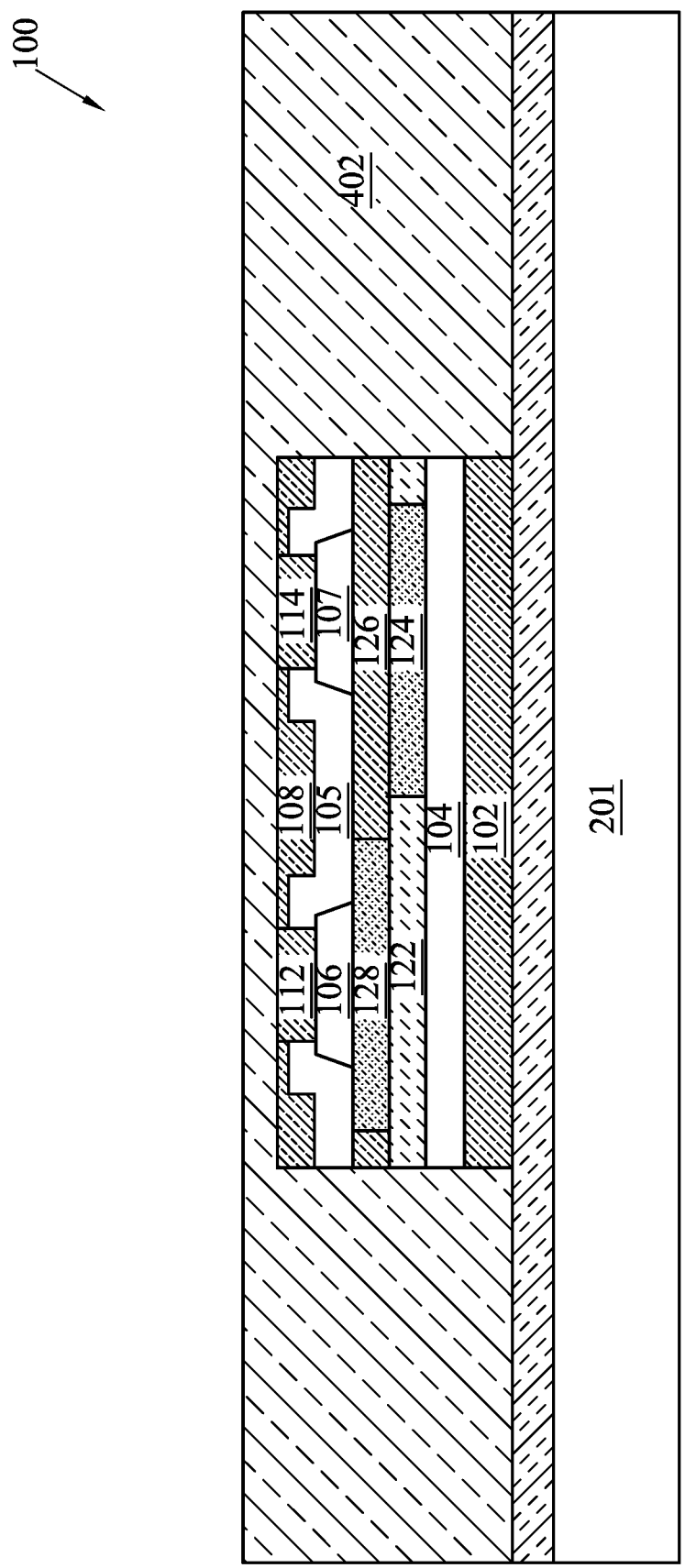

FIG. 4 illustrates a cross sectional view of the semiconductor device shown in FIG. 3 after a molding compound layer is formed over the carrier in accordance with various embodiments of the present disclosure. After the molding compound layer 402 is formed over the carrier 201, the semiconductor chip 140 is embedded in the molding compound layer 402 as shown in FIG. 4.

In some embodiments, the molding compound layer 402 may be an epoxy, which is dispensed at the gaps described above. The epoxy may be applied in a liquid form, and may harden after a curing process. In alternative embodiments, the molding compound layer 402 may be formed of curable materials such as polymer based materials, resin based materials, polyimide, epoxy and any combinations of thereof. The molding compound layer 402 can be formed by any suitable dispense techniques.

Figure 5:
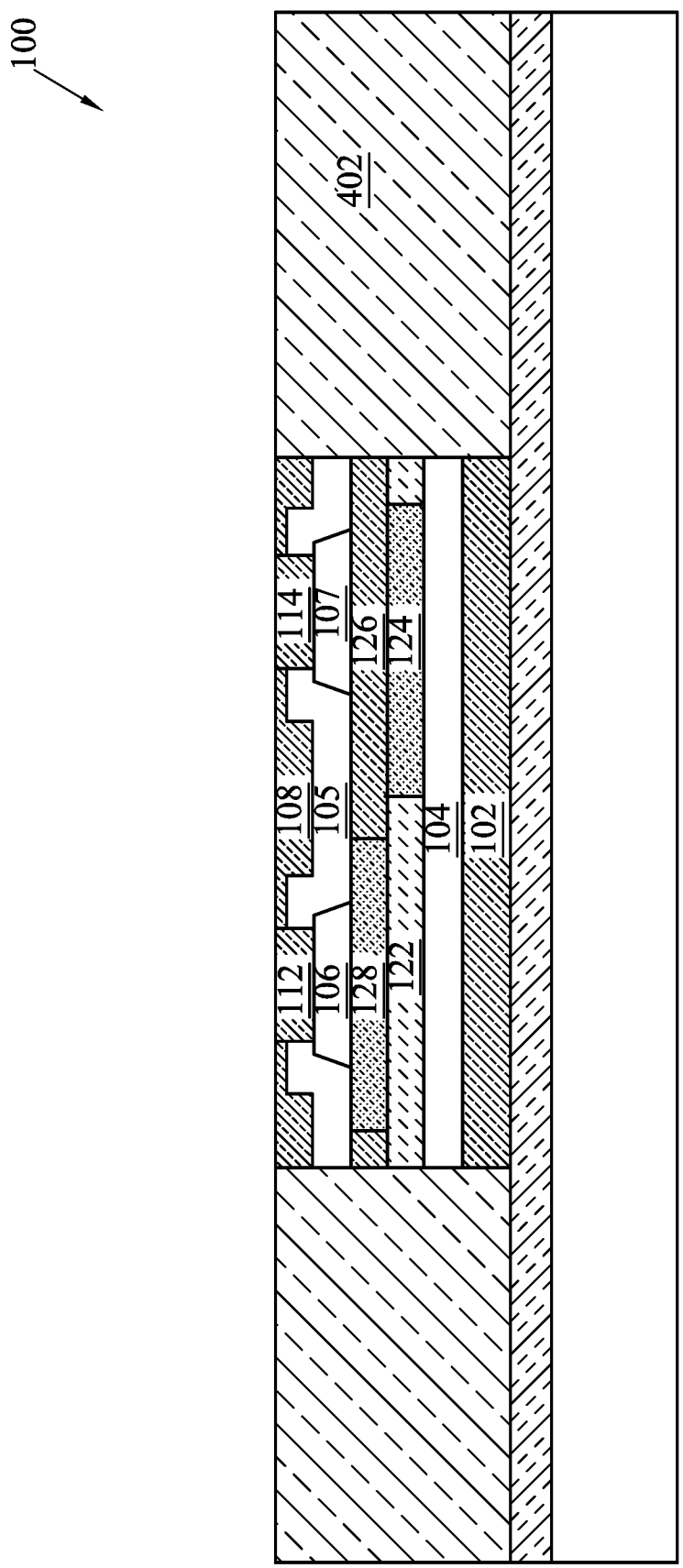

FIG. 5 illustrates a cross sectional view of the semiconductor device shown in FIG. 4 after a grinding process is applied to the top surface of the molding compound layer in accordance with various embodiments of the present disclosure. The top surface of the molding compound layer 402 undergoes a grinding process. The grinding process can employ a mechanical grinding process, a chemical polishing process, an etching process, any combinations thereof and/or the like.

As shown in FIG. 5, the grinding process is applied to the top surface of the molding compound layer 402 until the top surfaces of the connectors 112 and 114 become exposed. In particular, as shown in FIG. 5, the top surfaces of the connectors 112 and 114 may be exposed outside the molding compound layer 402. As a result of performing the grinding process, the top surfaces of the connectors 112 and 114 are substantially level with the top surface of the molding compound layer 402.

Figure 6:
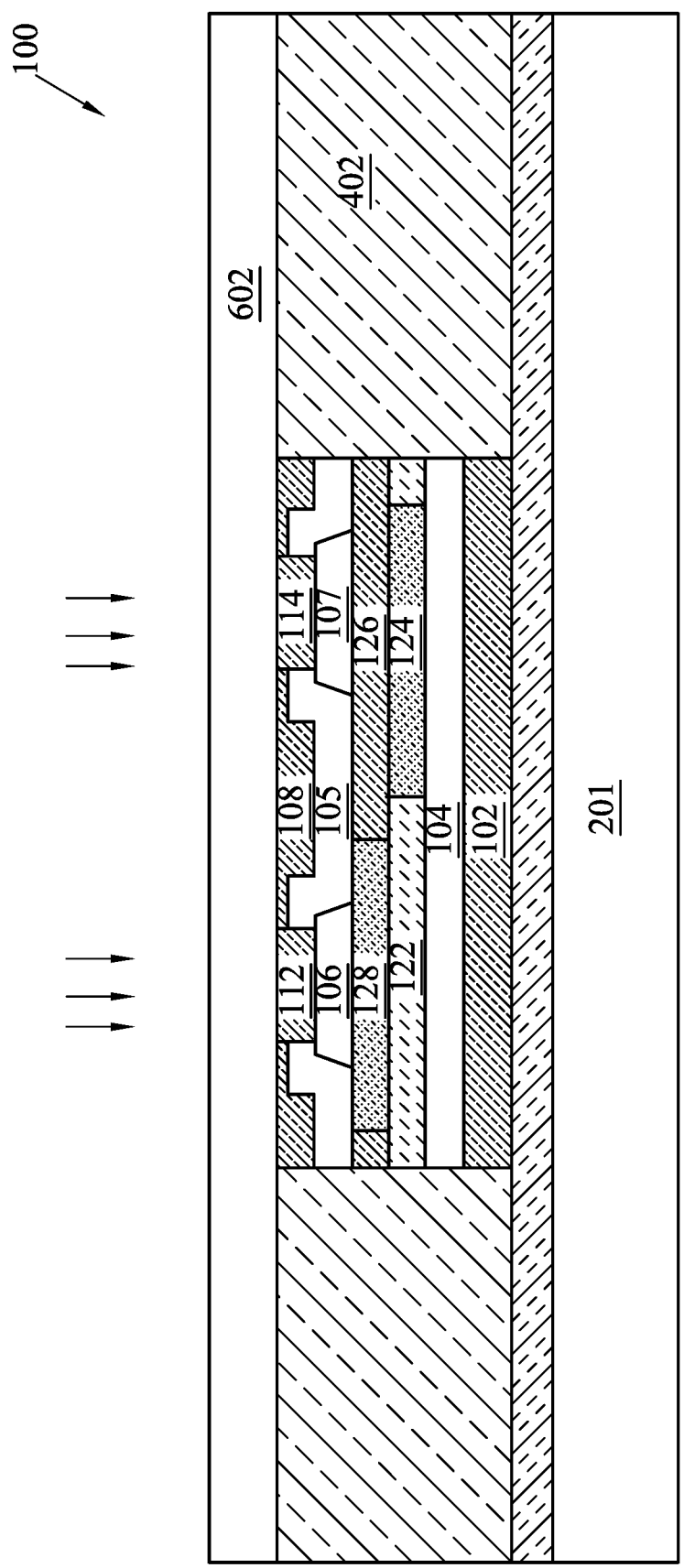

FIG. 6 illustrates a cross sectional view of the semiconductor device shown in FIG. 5 after a first photo-sensitive material is deposited over the molding compound layer in accordance with various embodiments of the present disclosure. A first photo-sensitive material layer 602 is formed over the molding compound layer 402. In accordance with some embodiments, the first photo-sensitive material layer 602 may be formed of suitable photo-sensitive materials such as PBO, SU-8 photo-sensitive epoxy, film type polymer materials and/or the like. The first photo-sensitive material layer 602 may be formed by suitable semiconductor fabrication techniques such as spin coating and/or the like.

In consideration of the location and shape of the via portions of the interconnect structures shown in FIG. 1, selective areas of the photo-sensitive material layer 602 are exposed to light. The physical properties of the photo-sensitive regions exposed to light change as a result. According to an embodiment, the change of the physical properties of the exposed regions will cause the exposed regions to be etched away when a developer is applied to the photo-sensitive material layer 602.

Figure 7:
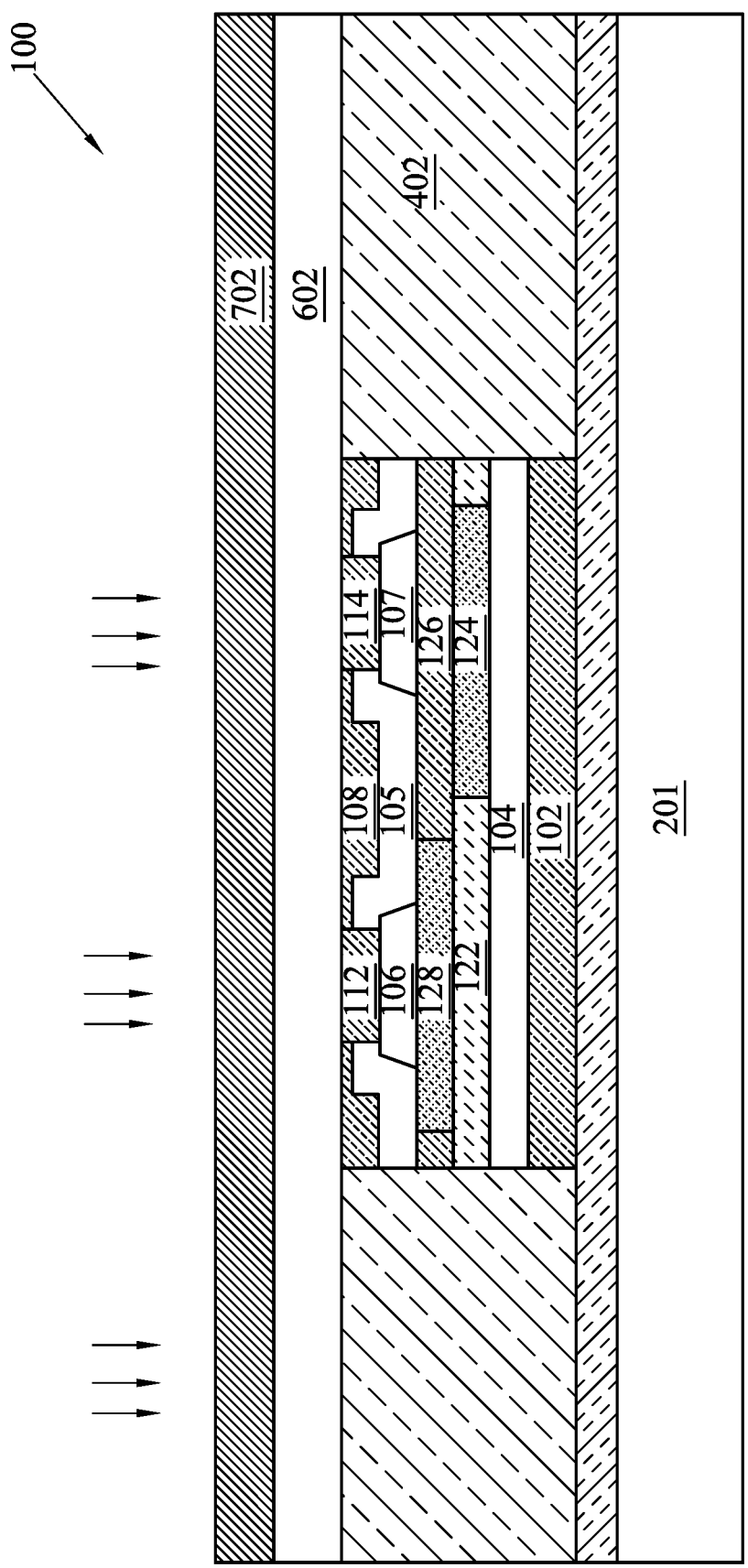

FIG. 7 illustrates a cross sectional view of the semiconductor device shown in FIG. 6 after a second photo-sensitive material layer is formed over the first photo-sensitive material layer in accordance with various embodiments of the present disclosure. The second photo-sensitive material layer 702 is similar to the first photo-sensitive material layer 602, and hence is not discussed in detail herein to avoid unnecessary repetition.

In consideration of the location and shape of the metal line portions of the interconnect structures shown in FIG. 1, selective areas of the second photo-sensitive material layer 702 are exposed to light. The physical properties of the photo-sensitive regions exposed to light change as a result. According to an embodiment, the change of the physical properties of the exposed regions will cause the exposed regions to be etched away when a developer is applied to the second photo-sensitive material layer 702.

Figure 8:
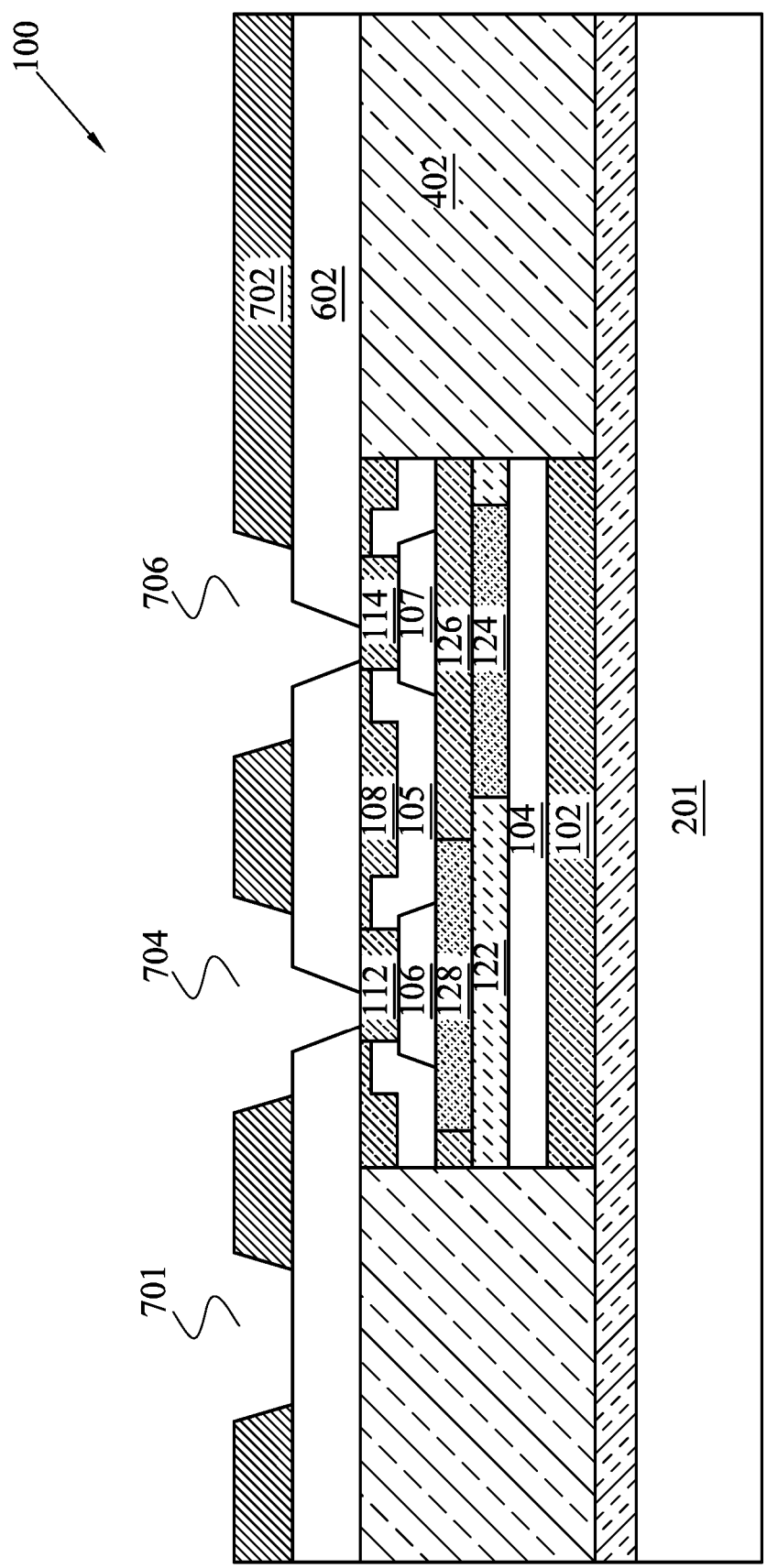

FIG. 8 illustrates a cross sectional view of the semiconductor device shown in FIG. 7 after a plurality of openings are formed in accordance with various embodiments of the present disclosure. A suitable developer is applied to the first photo-sensitive material layer 602 and the second photo-sensitive material layer 702. As a result, a variety of openings 701, 704 and 706 are formed in the first photo-sensitive material layer 602 and the second photo-sensitive material layer 702. The formation of the openings 701, 704 and 706 involves lithography operations, which are well known, and hence are not discussed in further detail herein to avoid unnecessary repetition.

After the openings 701, 704 and 706 have been formed, a suitable post-development curing process may be applied to the first photo-sensitive material layer 602 and the second photo-sensitive material layer 702.

Figure 9:
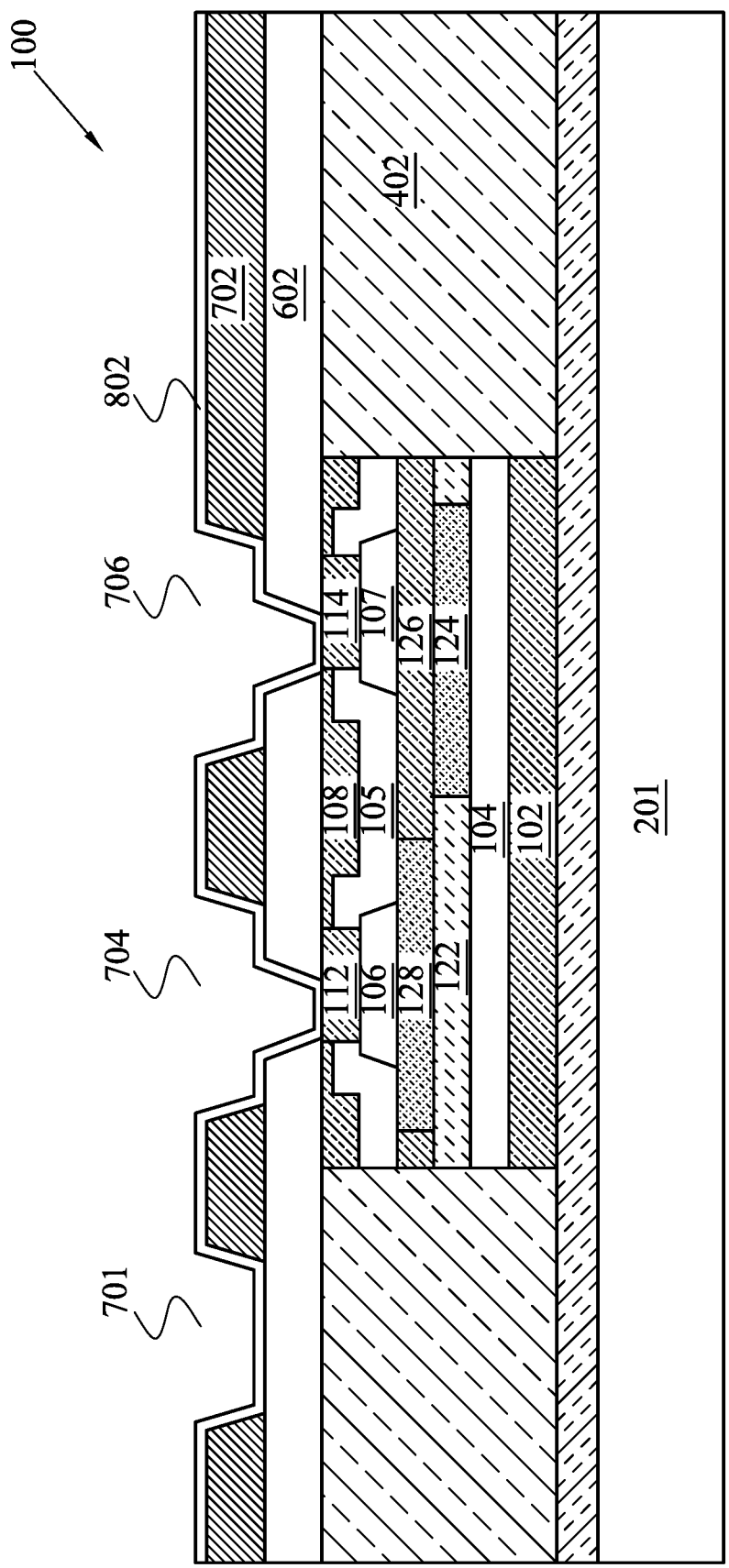

FIG. 9 illustrates a cross sectional view of the semiconductor device shown in FIG. 8 after a seed layer is formed in the openings in accordance with various embodiments of the present disclosure. A seed layer 802 is formed on the bottoms and sidewalls of the openings 701, 704 and 706. The seed layer 802 may be formed of copper, nickel, gold, titanium, any combinations thereof and/or the like. The seed layer 802 may be formed by suitable deposition techniques such as physical vapor deposition (PVD), CVD and/or the like. The seed layer 802 may have a thickness of between about 500 Angstroms and about 8,000 Angstroms.

Figure 10:
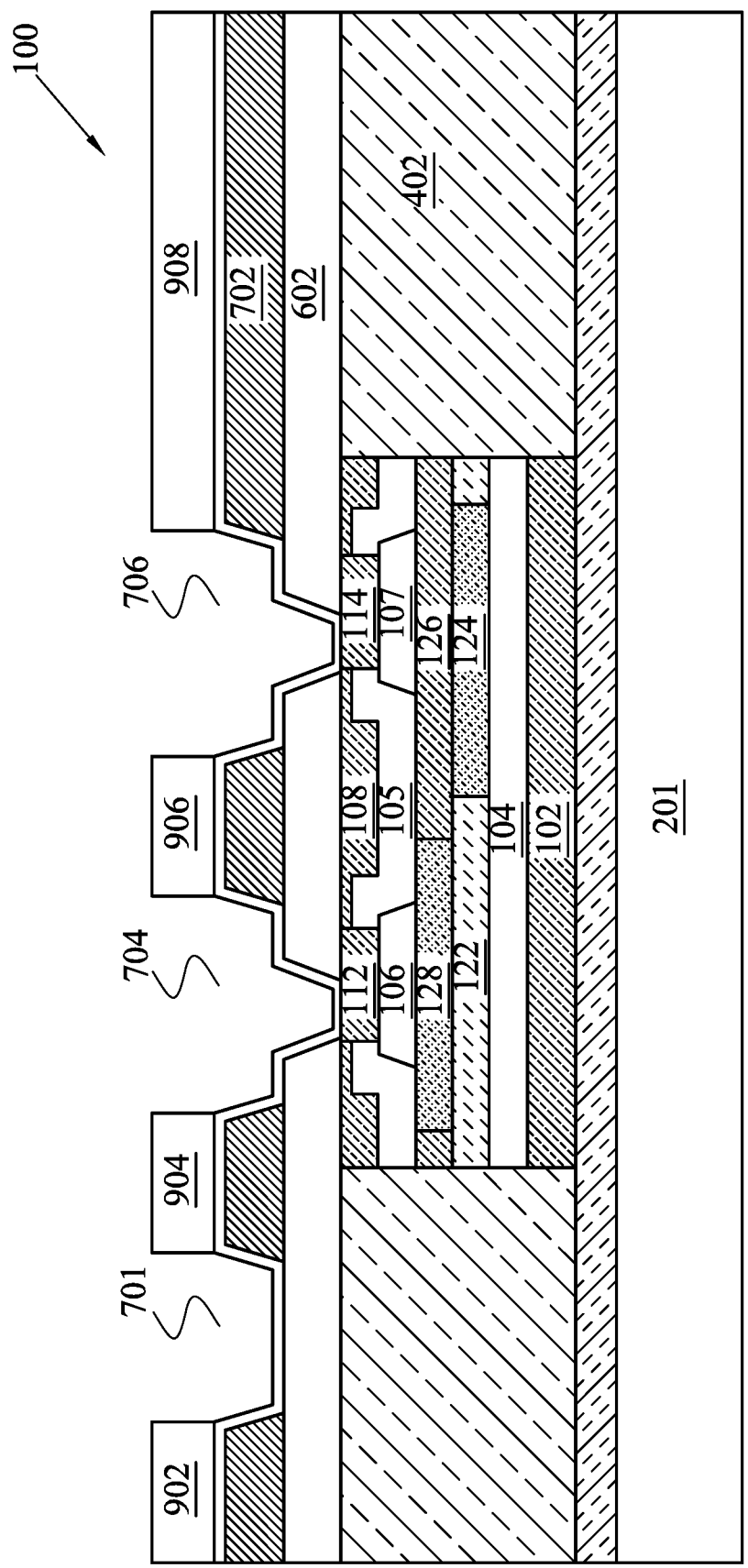

FIG. 10 illustrates a cross sectional view of the semiconductor device shown in FIG. 9 after a photoresist layer has been formed in accordance with various embodiments of the present disclosure. A photoresist layer is formed over the top surfaces of the non-opening portions of the seed layer 802. As shown in FIG. 10, the photoresist layer includes four portions, namely a first portion 902, a second portion 904, a third portion 906 and a fourth portion 908. The thickness of the photoresist layer is greater than 5 um. The edges of the photoresist layer are vertically aligned with the sidewalls of the openings 701, 704 and 706. For example, the left edge of the second portion 904 is vertically aligned with the sidewall of the opening 701.

In accordance with some embodiments, the photoresist layer may be formed of suitable photoresist materials such as SU-8 photo-sensitive epoxy, film type polymer materials and/or the like. The photoresist layer may be formed by suitable semiconductor fabrication techniques such as spin coating, dry film laminating and/or the like.

One advantageous feature of having the photoresist layer shown in FIG. 10 is the photoresist layer helps to form a thick interconnect structure through a plating process, which will be described in detail with respect to FIG. 11.

Figure 11:
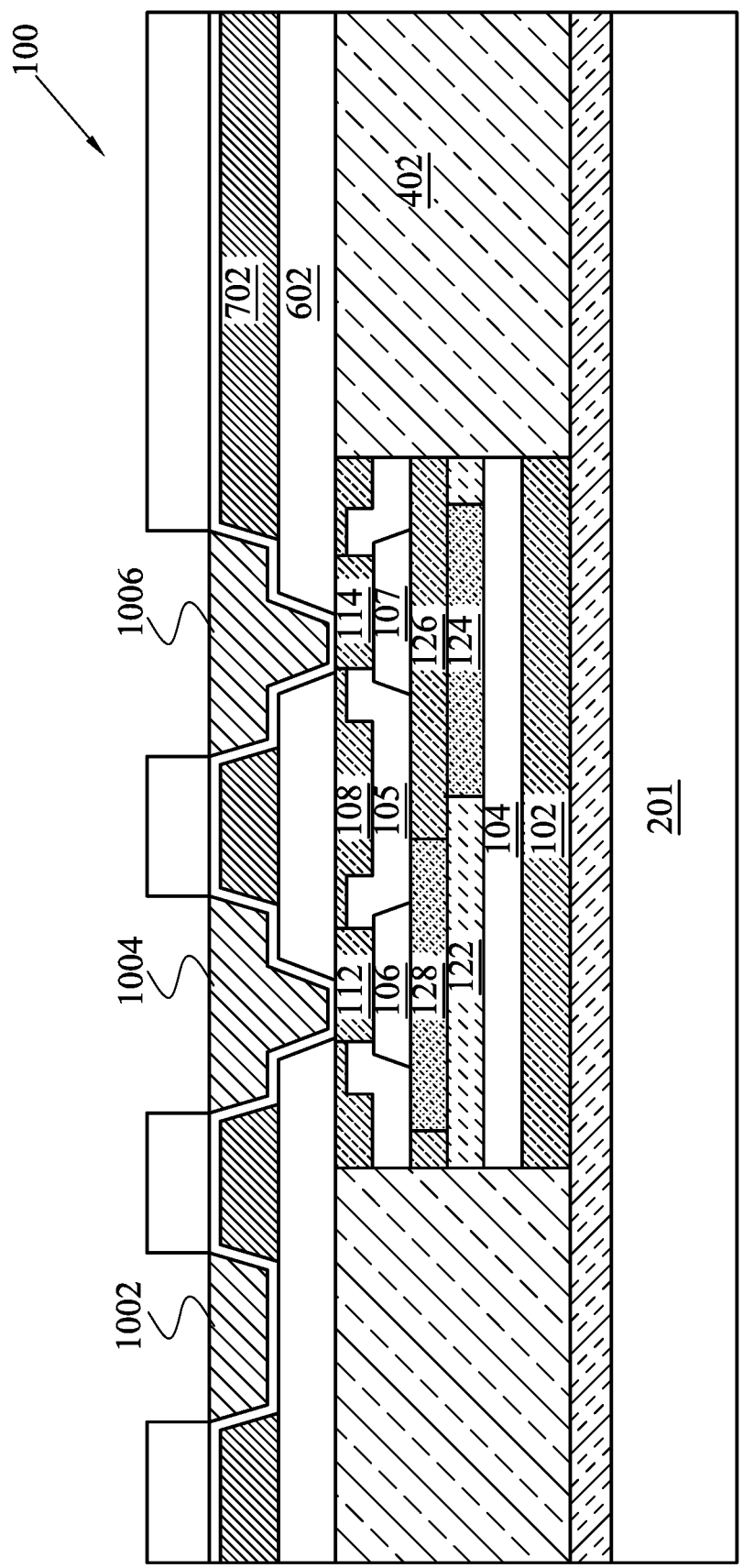

FIG. 11 illustrates a cross sectional view of the semiconductor device shown in FIG. 10 after a plating process is applied to the semiconductor device in accordance with various embodiments of the present disclosure. The openings on top of the seed layer 802 may be filled with a conductive material. The conductive material may comprise copper, although other suitable materials such as aluminum, alloys, tungsten, silver, doped polysilicon, combinations thereof, and/or the like, may alternatively be utilized.

The openings 701, 704 and 706 may be filled with the conductive material by a plating process. In particular, the plating process is a bottom-up plating process. During the plating process, the conductive material such as copper grows from the bottoms as well as the sidewalls of the openings 701, 704 and 706. After the plating process finishes, the interconnect structures 1002, 1004 and 1006 are formed in their respective openings. As shown in FIG. 11, each interconnect structure has a substantially planar surface. Such a planar surface is substantially level with the bottom surface of the photoresist layer.

The interconnect structures 1002, 1004 and 1006 may function as a redistribution layer. Throughout the description, the interconnect structures 1002, 1004 and 1006 may be alternatively referred to as a redistribution layer.

Figure 12:
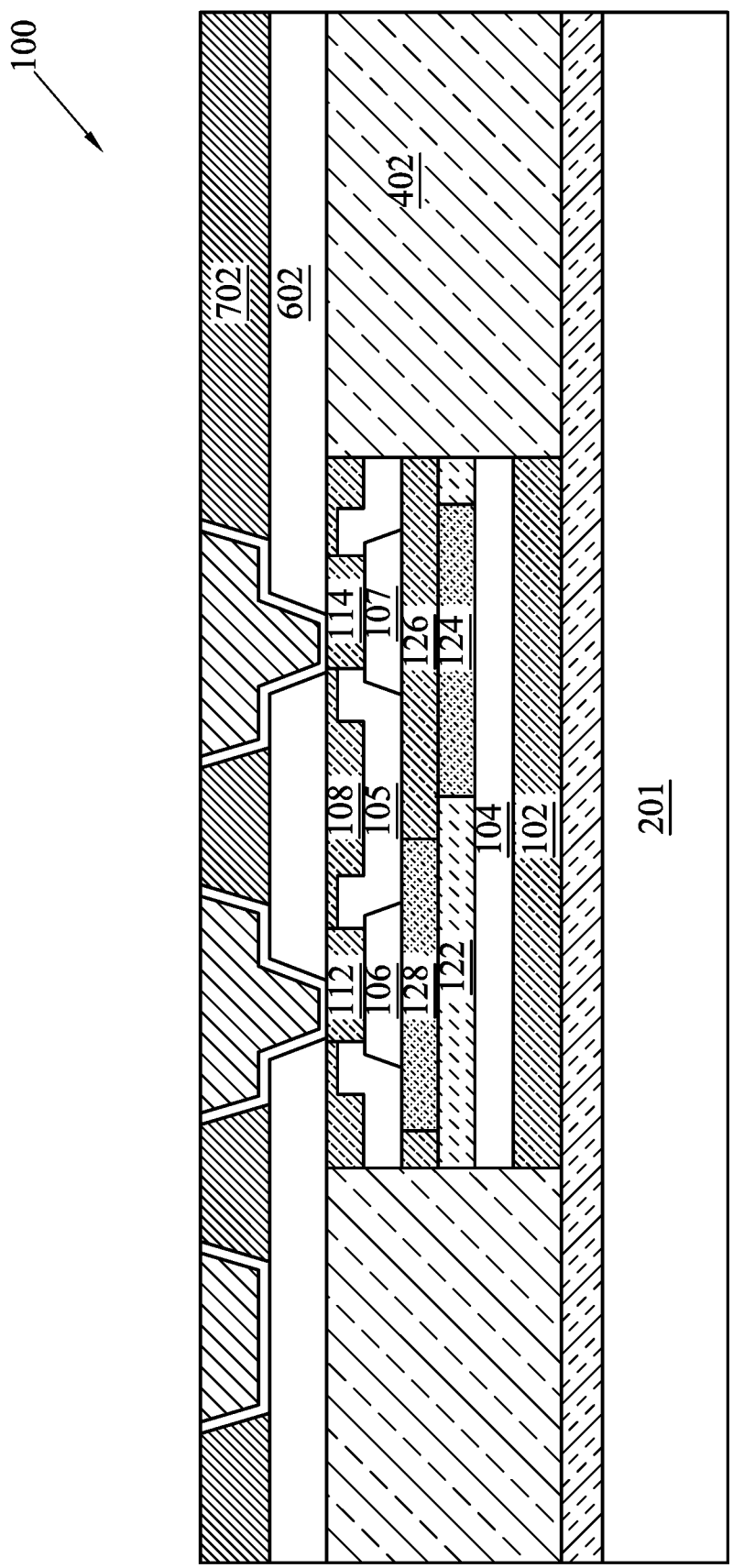

FIG. 12 illustrates a cross sectional view of the semiconductor device shown in FIG. 11 after the remaining photoresist layer has been removed in accordance with various embodiments of the present disclosure. In some embodiments, the remaining photoresist layer shown in FIG. 11 may be removed by using suitable photoresist stripping techniques such as chemical solvent cleaning, plasma ashing, dry stripping and/or the like. The photoresist stripping techniques are well known and hence are not discussed in further detail herein to avoid unnecessary repetition. After the remaining photoresist layer has been removed, the exposed seed layer may be removed by a suitable etching process such as a wet etching process.

Figure 13:
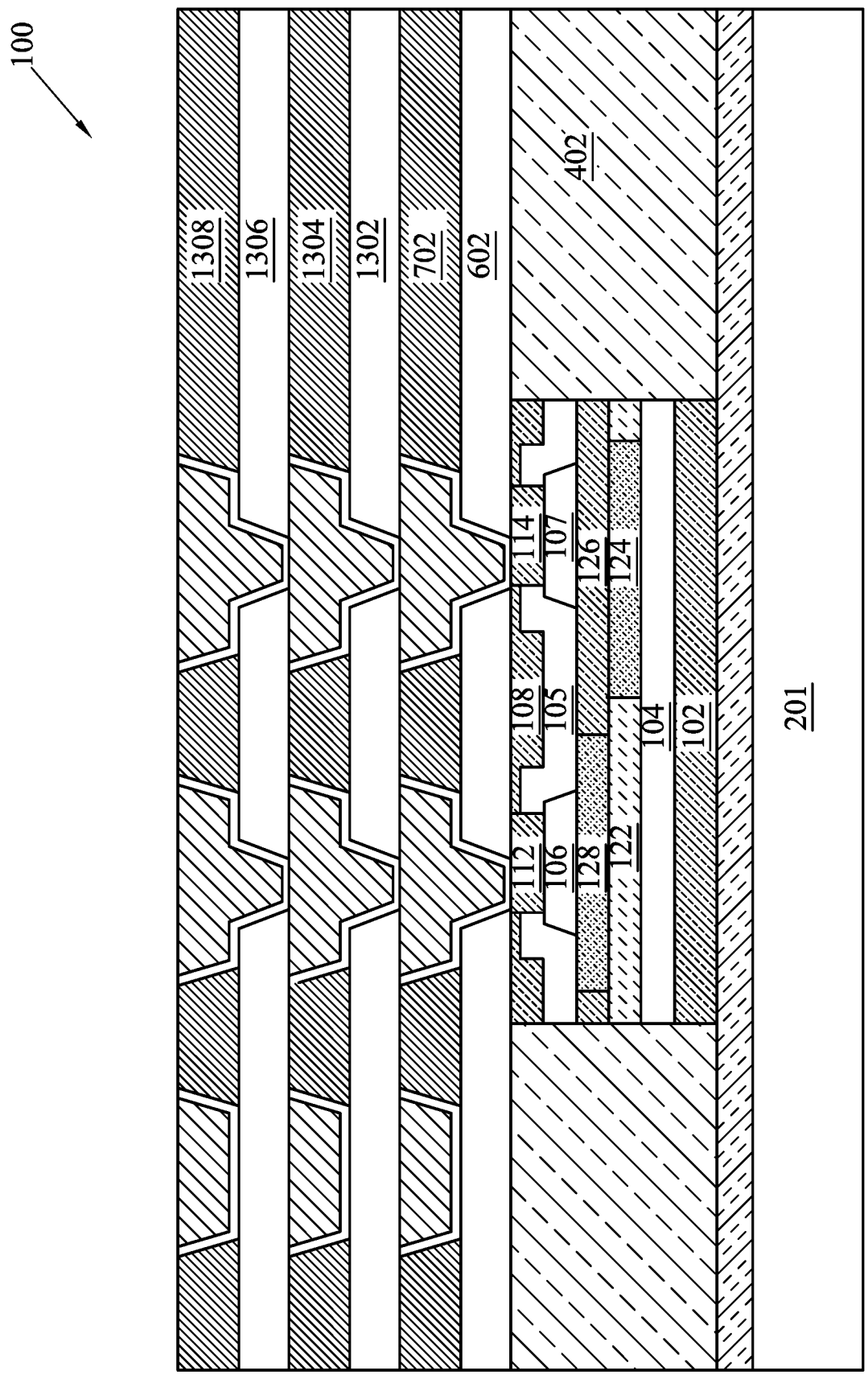

FIG. 13 illustrates a cross sectional view of the semiconductor device shown in FIG. 12 after two additional interconnect layers have been formed over the carrier in accordance with various embodiments of the present disclosure. Photo-sensitive material layers 1302, 1304, 1306 and 1306 are formed over the second photo-sensitive material layer 702. After the photo-sensitive material layers have been formed, the interconnect structures are formed by a fabrication process similar to that shown in FIGS. 8-12, and hence is not discussed in detail to avoid repetition.

Figure 14:
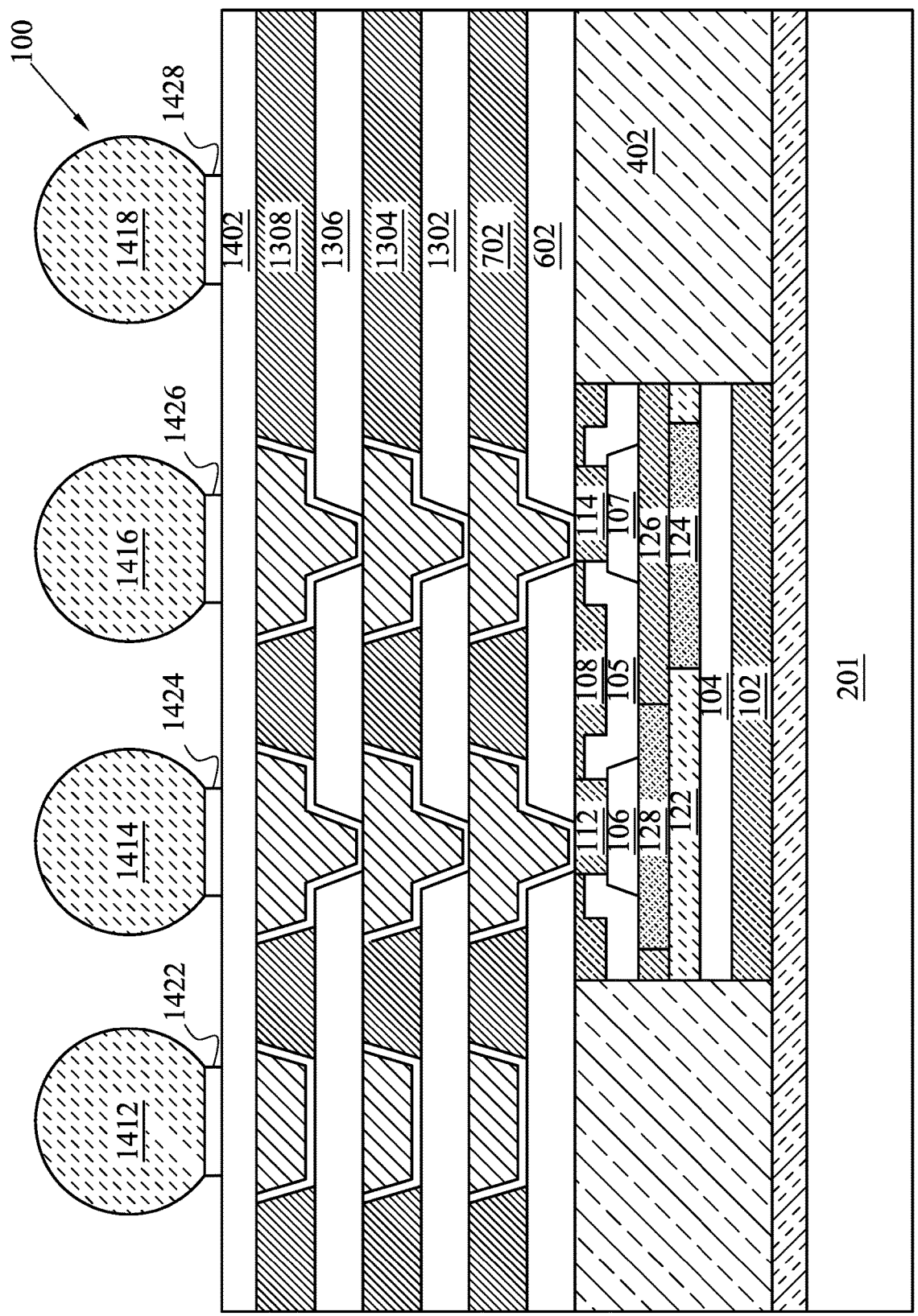

FIG. 14 illustrates a cross sectional view of the semiconductor device shown in FIG. 13 after a plurality of bumps are formed over the interconnect structures in accordance with various embodiments of the present disclosure. A dielectric layer 1402 is formed over the photo-sensitive material layer 1308. The dielectric layer 1402 may be formed of a nitride such as silicon nitride, an oxide such as silicon oxide, phosphosilicate glass (PSG), borosilicate glass (BSG), boron-doped phosphosilicate glass (BPSG), any combinations thereof and/or the like. The dielectric layer 1402 may be formed by suitable fabrication techniques such as such as spinning, CVD, PECVD and/or the like.

A plurality of UBM structures 1422, 1424, 1426 and 1428, and their respective bumps 1412, 1414, 1416 and 1418 are formed over the dielectric layer 1402 as shown in FIG. 14. The UBM structures 1422, 1424, 1426 and 1428 help to prevent diffusion between the solder balls and the integrated circuits of the semiconductor device, while providing a low resistance electrical connection.

In some embodiments, the bumps 1412, 1414, 1416 and 1418 are solder balls. In some embodiments, the solder balls may comprise SAC405. SAC405 comprises 95.5% Sn, 4.0% Ag and 0.5% Cu.

Figure 15:
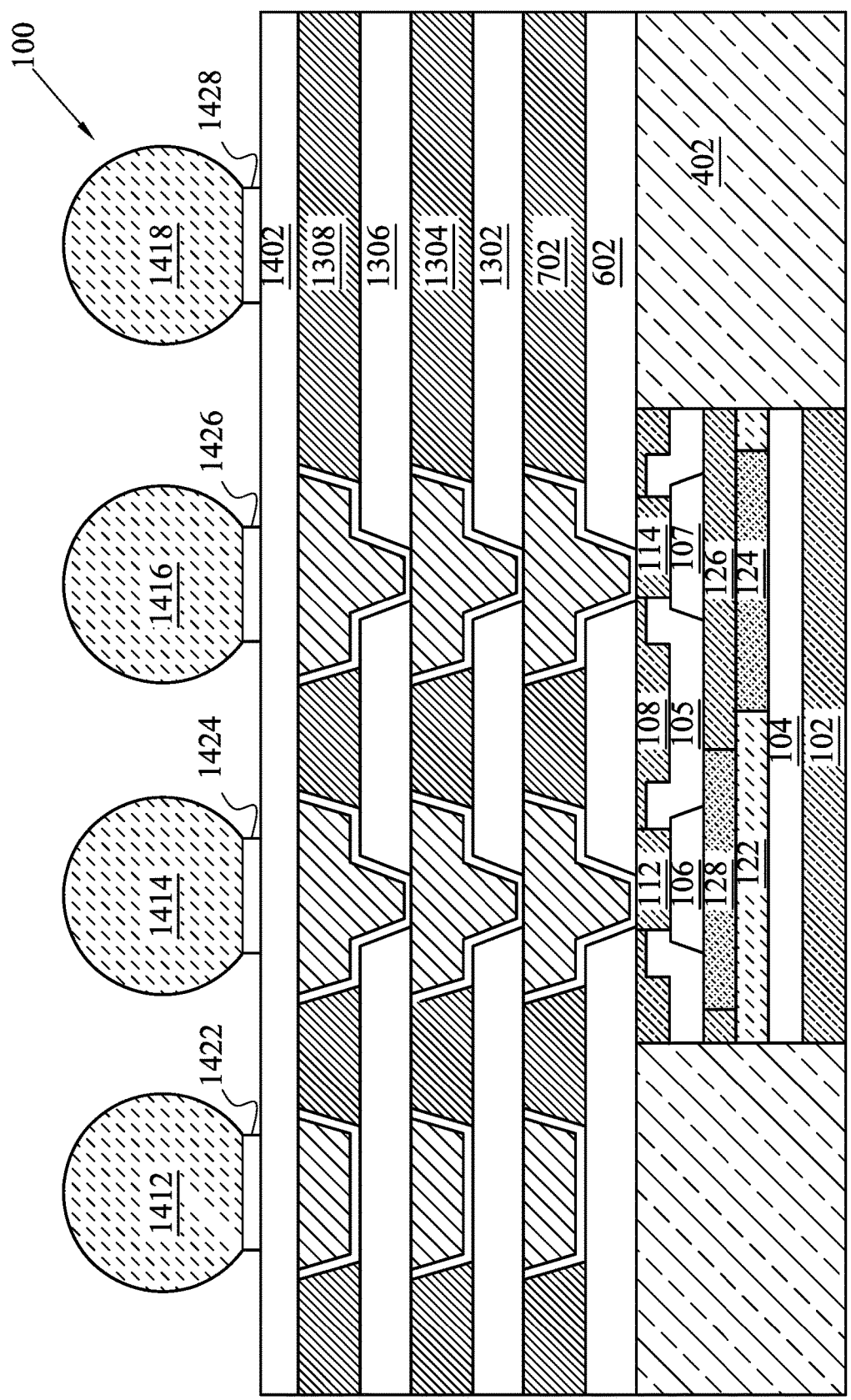

FIG. 15 illustrates a cross sectional view after a process of removing the carrier has been applied to the semiconductor device in accordance with various embodiments of the present disclosure. The carrier 201 shown in FIG. 14 can be detached from the semiconductor device 100. A variety of detaching processes may be employed to separate the semiconductor device 100 from the carrier 201. The variety of detaching processes may comprise a chemical solvent, a UV exposure and the like. The release layer 103 may be removed from the semiconductor device 100 by using a suitable etching process.

Figure 16:
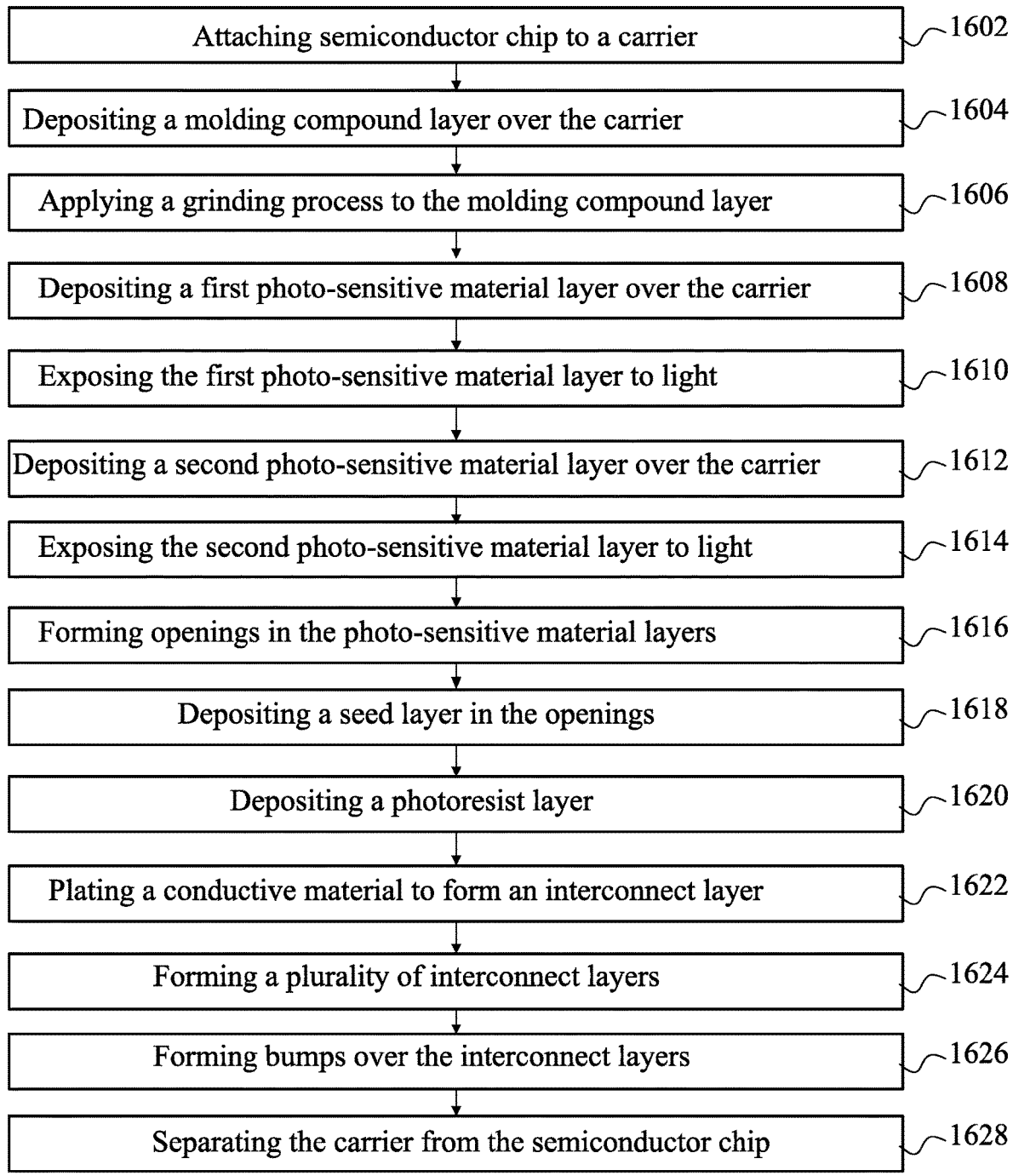
FIG. 16 illustrates a flow chart of a method for forming the semiconductor device shown in FIG. 1 in accordance with various embodiments of the present disclosure.

FIG. 16 illustrates a flow chart of a method for forming the semiconductor device shown in FIG. 1 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 16 may added, removed, replaced, rearranged and repeated.

At step 1602, a semiconductor chip or a semiconductor structure is attached to a carrier through a release layer. The semiconductor chip comprises a substrate. The backside of the substrate is in direct contact with the release layer.

At step 1604, a molding compound layer is formed over the carrier. The semiconductor chip is embedded in the molding compound layer. At step 1606, a grinding process is applied to the molding compound layer until the top surface of the semiconductor chip is exposed.

At step 1608, a first photo-sensitive material layer is deposited over the molding compound layer. At step 1610, the first photo-sensitive material layer is exposed to light according to a first pattern.

At step 1612, a second photo-sensitive material layer is deposited over the first photo-sensitive material layer. At step 1614, the second photo-sensitive material layer is exposed to light according to a second pattern.

At step 1616, a plurality of openings are formed in the first photo-sensitive material layer and the second photo-sensitive material layer by applying a developer to the first photo-sensitive material layer and the second photo-sensitive material layer. At step 1618, a seed layer is deposited on bottoms and sidewalls of the plurality of openings.

At step 1620, a photoresist layer is formed on the second photo-sensitive material layer. At step 1622, through a plating process, a conductive material is filled in the openings to form a first interconnect layer including a plurality of interconnect structures. At step 1624, a plurality of interconnect layers are formed over the first interconnect layer.

At step 1626, a dielectric layer is deposited over the plurality of interconnect layers. A plurality of UBM structures are formed over the dielectric layer. A plurality of bumps are formed over their respective UBM structures. At step 1628, a suitable carrier removal technique is employed to separate the carrier from the semiconductor device.

In accordance with an embodiment, a method comprises embedding a semiconductor structure in a molding compound layer, depositing a plurality of photo-sensitive material layers over the molding compound layer, developing the plurality of photo-sensitive material layers to form a plurality of openings, wherein a first portion and a second portion of an opening of the plurality of openings are formed in different photo-sensitive material layers and filling the plurality of openings with a conductive material to form a first via in the first portion and a first redistribution layer in the second portion.

In accordance with an embodiment, a method comprises embedding a semiconductor structure in a molding compound layer, depositing a plurality of photo-sensitive material layers over the molding compound layer, developing first photo-sensitive material layers to form a first opening, filling the first opening with a conductive material to form a first interconnect structure, developing second photo-sensitive material layers to form a second opening and filling the second opening with the conductive material to form a second interconnect structure, wherein edges of the second interconnect structure are vertically aligned with edges of the first interconnect structure.

In accordance with an embodiment, a method comprises embedding a semiconductor structure in a molding compound layer, exposing a top surface of the semiconductor structure through a grinding process, depositing a plurality of photo-sensitive material layers over the molding compound layer, developing first photo-sensitive material layers to form a first opening, filling the first opening with a conductive material to form a first interconnect structure, developing second photo-sensitive material layers to form a second opening wherein at least one edge of the second opening is vertically aligned with a corresponding edge of the first opening and filling the second opening with the conductive material to form a second interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a semiconductor structure embedded in a molding compound layer, the semiconductor structure comprising a connector;
a first polymer layer on the molding compound layer;
a second polymer layer on the first polymer layer;
a first via portion of a first interconnect structure in the first polymer layer and a first metal line portion of the first interconnect structure in the second polymer layer;
a third polymer layer on the second polymer layer;
a fourth polymer layer on the third polymer layer; and
a second via portion of a second interconnect structure in the third polymer layer and a second metal line portion of the second interconnect structure in the fourth polymer layer, an entirety of a bottom surface of the second interconnect structure is in direct contact with a top surface of the first interconnect structure, and the first metal line portion of the first interconnect structure is in direct contact with the first polymer layer, second polymer layer, and third polymer layer.

2. The device of claim 1, wherein:
a top surface of the connector is in direct contact with a bottom surface of the first via portion of the first interconnect structure.

3. The device of claim 1, wherein:
a center of the first via portion of the first interconnect structure is vertically aligned with a center of the second via portion of the second interconnect structure; and
a center of the first metal line portion of the first interconnect structure is vertically aligned with a center of the second metal line portion of the second interconnect structure.

4. The device of claim 1, wherein:
a top surface of the first metal line portion of the first interconnect structure is level with a top surface of the second polymer layer; and
a top surface of the second metal line portion of the second interconnect structure is level with a top surface of the fourth polymer layer.

5. The device of claim 1, further comprising:
a plurality of bumps on a plurality of under bump metallization structures, wherein the plurality of under bump metallization structures are on top of the fourth polymer layer.

6. The device of claim 5, wherein:
the plurality of bumps are electrically connected to the semiconductor structure through the first interconnect structure, the second interconnect structure, and a connector of the semiconductor structure.

7. The device of claim 6, wherein:
the first via portion of the first interconnect structure is electrically connected to the connector through a seed layer.

8. A device comprising:
a semiconductor die embedded in a molding compound layer, the semiconductor die comprising a first connector and a second connector, wherein top surfaces of the first and second connectors are level with a top surface of the molding compound layer;
a first polymer layer contacting the molding compound layer;
a second polymer layer contacting the first polymer layer;
a first interconnect comprising a first via portion in the first polymer layer and a first metal line portion in the second polymer layer;
a second interconnect comprising a second via portion in the first polymer layer and a second metal line portion in the second polymer layer;
a third polymer layer contacting the second polymer layer;
a fourth polymer layer contacting the third polymer layer;
a third interconnect comprising a third via portion in the third polymer layer and a third metal line portion in the fourth polymer layer; and
a fourth interconnect comprising a fourth via portion in the third polymer layer and a fourth metal line portion in the fourth polymer layer, wherein the third interconnect is over the first interconnect and the fourth interconnect is over the second interconnect, wherein a center of the third via portion of the third interconnect is vertically aligned with a center of the first via portion of the first interconnect, wherein a center of the fourth via portion of the fourth interconnect is vertically aligned with a center of the second via portion of the second interconnect.

9. The device of claim 8, wherein:
the first metal line portion of the first interconnect and the second metal line portion of the second interconnect are in direct contact with the first polymer layer, second polymer layer, and third polymer layer.

10. The device of claim 8, wherein:
a top surface of the second polymer layer is level with top surfaces of the first metal line portion of the first interconnect and the second metal line portion of the second interconnect; and
a top surface of the fourth polymer layer is level with top surfaces of the third metal line portion of the third interconnect and the fourth metal line portion of the fourth interconnect.

11. The device of claim 8, further comprising:
a first seed layer that electrically connects the first via portion of the first interconnect to the first connector; and
a second seed layer that electrically connects the second via portion of the second interconnect to the second connector.

12. The device of claim 8, wherein:
an outermost edge of a sidewall of the first via portion of the first interconnect is vertically aligned with an outermost edge of a sidewall of the third via portion of the third interconnect;
an outermost edge of a sidewall of the second via portion of the second interconnect is vertically aligned with an outermost edge of a sidewall of the fourth via portion of the fourth interconnect;
an outermost edge of a sidewall of the first metal line portion of the first interconnect is vertically aligned with an outermost edge of a sidewall of the third metal line portion of the third interconnect; and
an outermost edge of a sidewall of the second metal line portion of the second interconnect is vertically aligned with an outermost edge of a sidewall of the fourth metal line portion of the fourth interconnect.

13. A device comprising:
a semiconductor chip surrounded by a molding compound layer, the semiconductor chip comprising a polymer layer;
a first connector and a second connector in the polymer layer, wherein lower portions of the first connector and the second connector are surrounded by a first passivation layer, and upper portions of the first connector and the second connector are surrounded by the polymer layer;
a first photo-sensitive layer over the semiconductor chip and molding compound layer;
a second photo-sensitive layer over the first photo-sensitive layer;
a first via portion of a first interconnect structure in the first photo-sensitive layer and a first metal line portion of the first interconnect structure in the second photo-sensitive layer, wherein the first via portion contacts the first connector; and
a second via portion of a second interconnect structure in the first photo-sensitive layer and a second metal line portion of the second interconnect structure in the second photo-sensitive layer, wherein the second via portion contacts the second connector.

14. The device of claim 13, wherein:
a top surface of the first metal line portion is level with a top surface of the second metal line portion.

15. The device of claim 13, wherein:
the first passivation layer comprises an extremely low-k (ELK) dielectric material.

16. The device of claim 15, wherein:
a material of the first passivation layer and a material of the polymer layer are different.

17. The device of claim 13, further comprising:
a third photo-sensitive layer over the second photo-sensitive layer;
a fourth photo-sensitive layer over the third photo-sensitive layer;
a third via portion of a third interconnect structure in the third photo-sensitive layer and a third metal line portion of the third interconnect structure in the fourth photo-sensitive layer; and
a fourth via portion of a fourth interconnect structure in the third photo-sensitive layer and a fourth metal line portion of the fourth interconnect structure in the fourth photo-sensitive layer.

18. The device of claim 17, wherein:
the third via portion of the third interconnect structure is vertically aligned with the first via portion of the first interconnect structure, and the fourth via portion of the fourth interconnect structure is vertically aligned with the second via portion of the second interconnect structure.

19. The device of claim 18, further comprising:
a first bump over the third metal line portion of the third interconnect structure, and a second bump over the fourth metal line portion of the fourth interconnect structure, wherein the first bump and the second bump are electrically connected to the semiconductor chip through the first, second, third, and fourth interconnect structures.

20. The device of claim 13, wherein:
the first connector and the second connector comprise pillar structures.

* * * * *